United States Patent
Hegde et al.

(10) Patent No.: US 10,673,436 B1
(45) Date of Patent: Jun. 2, 2020

(54) FAILSAFE DEVICE

(71) Applicant: TEXAS INSTRUMENTS INCORPORATED, Dallas, TX (US)

(72) Inventors: Bharat Gajanan Hegde, Sirsi (IN); Devraj Matharampallil Rajagopal, Bangalore (IN); Srikanth Srinivasan, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/538,513

(22) Filed: Aug. 12, 2019

(30) Foreign Application Priority Data

Nov. 30, 2018 (IN) .............................. 201841045294

(51) Int. Cl.
  *H03K 19/007* (2006.01)
  *H03K 17/0814* (2006.01)
  *H03K 3/3562* (2006.01)
  *H03K 19/17788* (2020.01)

(52) U.S. Cl.
  CPC ....... *H03K 19/007* (2013.01); *H03K 3/35625* (2013.01); *H03K 17/08142* (2013.01); *H03K 19/17788* (2013.01)

(58) Field of Classification Search
  CPC ......... H03K 3/35625; H03K 17/08142; H03K 19/007; H03K 19/17788
  See application file for complete search history.

(56) References Cited

U.S. PATENT DOCUMENTS

| | | | |
|---|---|---|---|
| 2009/0027089 A1* | 1/2009 | Hebenstreit | H03K 19/018521 327/108 |
| 2009/0089605 A1* | 4/2009 | Westwick | H03K 17/22 713/340 |
| 2010/0097117 A1 | 4/2010 | Wang et al. | |
| 2011/0241752 A1 | 10/2011 | Wang et al. | |
| 2015/0091608 A1* | 4/2015 | Rajagopal | H03K 19/018521 326/14 |
| 2015/0365079 A1* | 12/2015 | Tsai | H03K 5/003 327/333 |
| 2017/0207050 A1* | 7/2017 | Sugiura | B60Q 1/0094 |

* cited by examiner

*Primary Examiner* — Alexander H Taningco
*Assistant Examiner* — Kurtis R Bahr
(74) *Attorney, Agent, or Firm* — John R. Pessetto; Charles A. Brill; Frank D. Cimino

(57) ABSTRACT

A device includes a failsafe circuit having a supply node configured to couple to a supply voltage source, a pad node configured to couple to an input/output (I/O) pin, and a bulk node configured to couple to a bulk of a transistor coupled to the I/O pin. The failsafe circuit is configured to assert a failsafe indicator signal when the supply node voltage falls below the pad node voltage by a threshold voltage, and couple the higher of the supply node voltage and the pad node voltage to the bulk node. The device also includes a pull-down stack coupled to the failsafe circuit and to a ground node, and a sub-circuit configured to turn off the pull-down stack in response to the supply node discharging to the threshold voltage below the pad node voltage.

13 Claims, 4 Drawing Sheets

FAILSAFE DEVICE

SUMMARY

In accordance with at least one example of the disclosure, a device includes a failsafe circuit having a supply node configured to couple to a supply voltage source, a pad node configured to couple to an input/output (I/O) pin, and a bulk node configured to couple to a bulk of a transistor coupled to the I/O pin. The failsafe circuit is configured to assert a failsafe indicator signal when the supply node voltage falls below the pad node voltage by a threshold voltage, and couple the higher of the supply node voltage and the pad node voltage to the bulk node. The device also includes a pull-down stack coupled to the failsafe circuit and to a ground node, and a sub-circuit configured to turn off the pull-down stack in response to the supply node discharging to the threshold voltage below the pad node voltage.

In accordance with another example of the disclosure, a device includes a failsafe circuit having a supply node configured to couple to a supply voltage source, a pad node configured to couple to an input/output (I/O) pin, and a bulk node configured to couple to a bulk of a transistor coupled to the I/O pin. The failsafe circuit includes a first transistor coupled to the supply node and to the bulk node, the first transistor having a control terminal coupled to a first node; a second transistor coupled to the bulk node and to the pad node, the second transistor having a control terminal coupled to the supply node; a third transistor coupled to the pad node and to the first node, the third transistor having a control terminal coupled to the supply node; a fourth transistor coupled to the first node and to a second node, the fourth transistor having a control terminal coupled to the supply node; a fifth transistor coupled to the second node and to a ground node, the fifth transistor having a control terminal coupled to the supply node; a sixth transistor coupled to the pad node, the sixth transistor having a control terminal coupled to the supply node; a seventh transistor coupled to the sixth transistor and to a third node, the seventh transistor having a control terminal coupled to the first node; and an eighth transistor coupled to the supply node and to the second node, the eighth transistor having a control terminal coupled to the third node.

In accordance with yet another example of the disclosure, a system includes an input/output (I/O) circuit including a final-stage transistor coupled to an I/O pin and to a supply voltage source, the final-stage transistor having a control terminal configured to be coupled to an analog signal source. The system also includes a failsafe circuit, including a first transistor coupled to the supply voltage source and to a bulk of the final-stage transistor, the first transistor having a control terminal coupled to a first node; a second transistor coupled to the bulk and to the I/O pin, the second transistor having a control terminal coupled to the supply voltage source; a third transistor coupled to the I/O pin and to the first node, the third transistor having a control terminal coupled to the supply voltage source; a fourth transistor coupled to the first node and to a second node, the fourth transistor having a control terminal coupled to the supply voltage source; a fifth transistor coupled to the second node and to a ground node, the fifth transistor having a control terminal coupled to the supply voltage source; a sixth transistor coupled to the I/O pin, the sixth transistor having a control terminal coupled to the supply voltage source; a seventh transistor coupled to the sixth transistor and to a third node, the seventh transistor having a control terminal coupled to the first node; and an eighth transistor coupled to the supply voltage and to the second node, the eighth transistor having a control terminal coupled to the third node.

BRIEF DESCRIPTION OF THE DRAWINGS

For a detailed description of various examples, reference will now be made to the accompanying drawings in which.

DETAILED DESCRIPTION

Certain analog devices require their input/output (I/O) pins to be failsafe compliant. For example, many audio devices require such failsafe compliance. In these examples, failsafe compliance refers to a condition in which an I/O pin of a device can be driven by an external source without drawing current when a supply voltage source is not providing voltage to a supply node of the device. If a device is not failsafe compliant, an external source driving the I/O pin when the supply voltage for the device is not available may cause current to flow from the I/O pin to the supply node, which may in turn damage other components of the device. Further, an external driver of the I/O pin does not anticipate supplying current to the device, which may violate a number of operability specifications of the device and the external driver in communication with the device.

As will be explained in further detail below, a final-stage transistor is coupled to the I/O pin and to the supply node of the device. The final-stage transistor includes a body diode that, when forward biased, permits current to flow from the I/O pin to the supply node. The final-stage transistor body diode becomes forward biased when the voltage of the supply node falls below the voltage of the I/O pin (e.g., when the supply voltage source is unavailable and an external driver is attempting to drive the I/O pin). One solution is to utilize an external voltage comparison circuit to ensure that the final-stage transistor body diode is always reverse biased by providing the higher of the supply node voltage and the I/O pin (or "pad node") voltage to the bulk or body of the final-stage transistor. However, in certain cases (e.g., as the supply node voltage decreases or discharges) a metastable condition may occur where the supply node voltage is not able to fully discharge, resulting in a current path between the pad node and the supply node.

Examples of the present disclosure address the foregoing issues by providing failsafe circuitry that asserts a failsafe indicator signal once the supply node voltage falls below the pad node voltage by a threshold voltage (Vt). In the absence of this failsafe circuitry, conventional voltage comparison circuits may not fully assert, or may not assert quickly enough, a similar failsafe indicator signal, resulting in the metastability and current path from the pad node to the supply node, explained above. The failsafe circuitry is explained more fully below.

Figure 1:
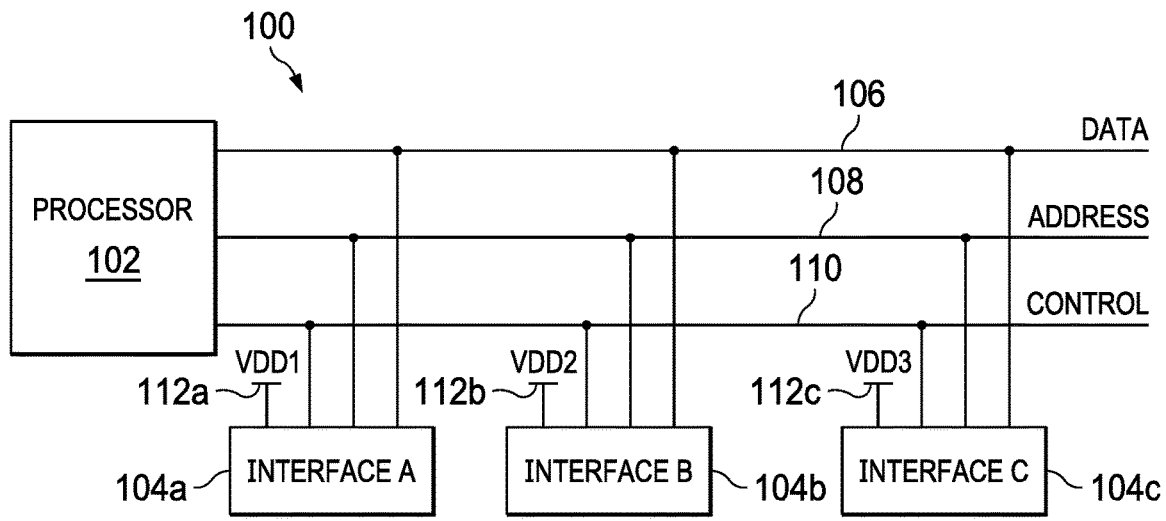
FIG. 1 shows a block diagram of a system in accordance with various examples.

FIG. 1 shows a block diagram of a system 100 in accordance with examples of this disclosure. The system 100 includes a processor 102 (e.g., a central processing unit (CPU)) coupled to one or more I/O interfaces 104a, 104b, 104c. The I/O interfaces 104 allow the processor 102 to communicate with external devices. A data bus 106 couples the processor 102 to each of the I/O interfaces 104a, 104b, 104c, and carries data transmitted by the processor 102 to the I/O interfaces 104 and provides data received by the I/O interface 104 to the processor 102. An address bus 108 couples the processor 102 to each of the I/O interfaces 104a, 104b, 104c and provides an address associated with data transmitted by the processor 102 to the I/O interface 104, or data received by the processor 102 from the I/O interface 104. A control bus 110 couples the processor 102 to each of the I/O interfaces 104a, 104b, 104c and a control signal carried by the control bus 110 specifies which of the I/O interfaces 104 is active, and whether it is transmitting or receiving data, for example to prevent collisions on the data bus 106 and the address bus 108. A supply node 112a, 112b, 112c of each of the I/O interfaces 104a, 104b, 104c, respectively, is provided with a supply voltage from a supply voltage source, which is not shown for simplicity. In one example, the supply voltage is the same for all of the I/O interfaces 104a, 104b, 104c. However, in other examples, the supply voltage differs for one or more of the 10 interfaces 104a, 104b, 104c.

Figure 2:
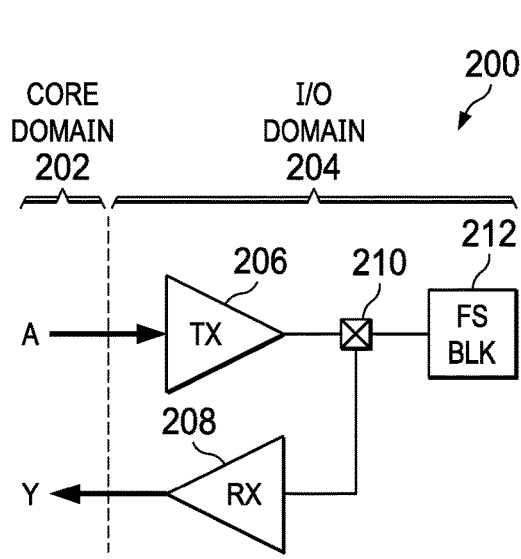
FIG. 2 shows a block diagram of an exemplary input/output (I/O) structure in accordance with various examples.

FIG. 2 shows a block diagram of an I/O structure 200 in accordance with examples of this disclosure. A core domain 202 corresponds to the processor 102 shown in FIG. 1. An I/O domain 204 corresponds to one of the I/O interfaces 104 shown in FIG. 1. In the I/O domain 204, a transmit path 206 provides data from the core domain 202 to an I/O pin 210. Similarly, a receive path 208 provides data from the I/O pin 210 to the core domain 202. An external failsafe circuit 212 is also coupled to the I/O pin 210. The external failsafe circuit 212 will be explained in further detail below.

Figure 3:
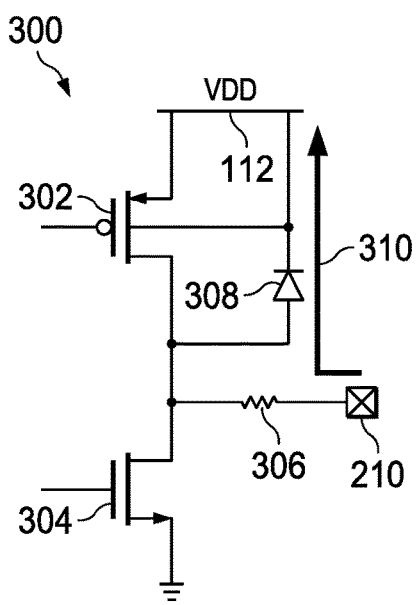
FIG. 3 shows a circuit diagram of an exemplary I/O structure in accordance with various examples.

FIG. 3 shows a circuit diagram of an exemplary internal I/O structure 300, for example that is part of the transmit path 206 shown in FIG. 2. As shown, the I/O structure 300 includes a final-stage transistor 302 coupled to the supply node 112 and to the I/O pin 210 by way of a resistor 306. Additionally, the I/O structure 300 includes a transistor 304 coupled to a ground node and to the I/O pin 210, also by way of the resistor 306. In this example, the transistor 302 is a p-type metal-oxide-semiconductor field-effect transistor (MOSFET), while the transistor 304 is an n-type MOSFET. In particular, a source of the p-type MOSFET 302 is coupled to the supply node 112 while a drain of the p-type MOSFET 302 is coupled to a drain of the n-type MOSFET 304, both of which are coupled to the I/O pin 210 by way of the resistor 306. A source of the n-type MOSFET 304 is coupled to a ground node.

A body diode 308 of the p-type MOSFET 302 is shown schematically to demonstrate the potential issues that arise when a voltage of the I/O pin 210 (a "pad node") is greater than a voltage of the supply node 112. In particular, when the voltage at the supply node 112 falls below the voltage of the pad node 210, the body diode 308 is forward biased, which permits current to flow from the I/O pin 210 to the supply node 112 as illustrated by current path 310. That is, in a situation where the supply voltage 112 of the I/O interface 104 (FIG. 1) is unavailable and an external device is driving the I/O pin 210, a current will be drawn by the I/O interface 104, which may both damage components of the I/O interface 104 as well as violate specifications that the external device should not provide current to the I/O pin 210 when driving the I/O pin 210.

Figure 4:
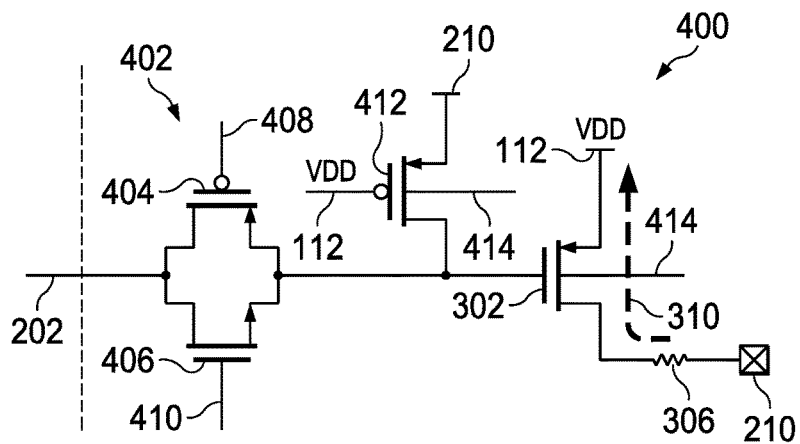
FIG. 4 shows a circuit diagram of an exemplary I/O output driver coupled to an I/O pin in accordance with various examples.

FIG. 4 shows an example I/O output driver 400 coupled to the I/O pin 210. The I/O output driver is, for example, part of the transmit path 206 explained above. The I/O output driver 400 includes a transmission gate 402 consisting of a p-type MOSFET 404 and an n-type MOSFET 406. An input of the transmission gate 402 includes a drain of the p-type MOSFET 404 that is coupled to a drain of the n-type MOSFET 406, both of which are coupled to the core domain 202 (FIG. 2). An output of the transmission gate 402 includes a source of the p-type MOSFET 404 that is coupled to a source of the n-type MOSFET 406.

A failsafe indicator signal is generated by failsafe circuitry (e.g., external to the transmit path 206), which will be explained in further detail below. A gate of the p-type MOSFET 404 is coupled to a node 408 that is provided with a failsafe indicator signal. A gate of the n-type MOSFET 406 is coupled to a node 410 that is provided with an inverted failsafe indicator signal. Thus, when the failsafe indicator signal is asserted, the node 408 is at a high voltage, which turns off the p-type MOSFET 404, while the inverted node 410 is at a low voltage, which in turn turns off the n-type MOSFET 406. When the failsafe indicator signal is asserted, the transmission gate 402 blocks transmission of data from the core domain 202 to the I/O pin 210.

The I/O output driver 400 also includes a p-type MOSFET 412 coupled to the output of the transmission gate 402 and to a pad node 210. In this example, the drain of the p-type MOSFET 412 is coupled to the output of the transmission gate 402, while a source of the p-type MOSFET 412 is coupled to the pad node 210. A gate of the p-type MOSFET 412 is coupled to a supply node 112 that is provided with a supply voltage VDD by a supply voltage source as explained above. When a voltage of the supply node 112 falls below a voltage of the pad node 210 by at least a threshold voltage (Vt), the p-type MOSFET 412 turns on, which pulls a gate of the p-type MOSFET 302 (e.g., a final-stage transistor) to the voltage of the pad node 210.

As explained above, providing the higher of the supply node 112 voltage and the pad node 210 voltage to the bulk of the final-stage transistor 302 ensures that the final-stage transistor 302 body diode is reverse biased. As will be explained further below, in accordance with examples of this disclosure, failsafe circuitry couples to a bulk node 414, which is coupled to the bulk of the final-stage transistor 302. In some examples, the bulk node 414 is also coupled to the bulk of the p-type MOSFET 412, so that the body diode of the p-type MOSFET 412 also remains reverse biased and there is no current from the pad node 210 to the supply node 112 even when the supply node 112 voltage is not available. The failsafe circuitry quickly and accurately asserts a failsafe indicator signal once the supply node 112 voltage falls below the pad node 210 voltage by a threshold voltage (Vt). As will be explained further below, the quick, accurate assertion of the failsafe indicator signal couples the bulk node 414 to the supply node 112 or the pad node 210, whichever voltage is greater. As a result, the body diodes of the final-stage transistor 302 and optional the p-type MOSFET 412 remain reverse biased and thus the I/O pin 210 cannot draw a current from an exterior device, even when the supply node 112 voltage is not available.

Figure 5:
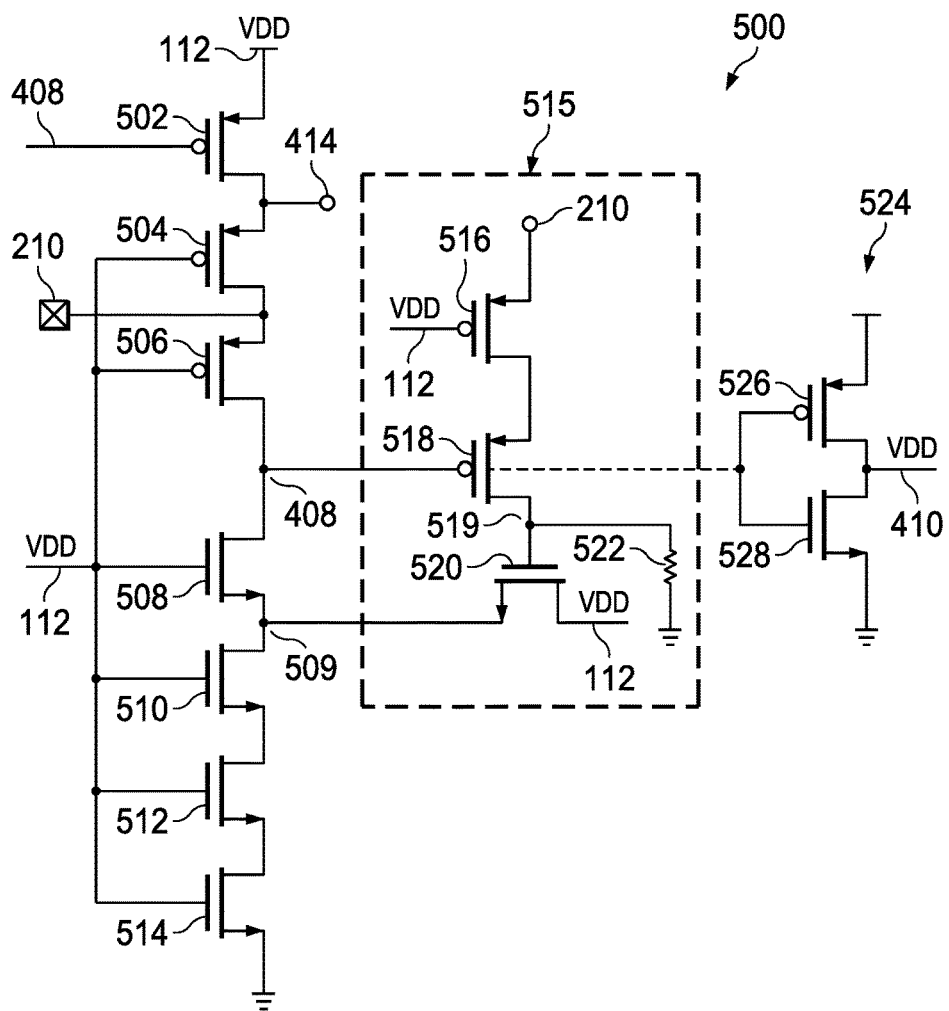
FIG. 5 shows a circuit diagram of a failsafe circuit in accordance with various examples.

FIG. 5 shows a circuit diagram of an example failsafe circuit 500 in accordance with examples of this disclosure. Throughout the failsafe circuit 500, common nodes are labeled in a like fashion. For example, the supply node 112 is configured to couple to a supply voltage source VDD, as explained above; the pad node 210 is configured to couple to an I/O pin; the node 408 corresponds to the failsafe indicator signal and the node 410 corresponds to the inverted failsafe indicator signal; finally, the bulk node 414 is configured to couple to the bulk of the final-stage transistor 302 and optionally to the bulk of the p-type MOSFET 412, described above.

The failsafe circuit 500 includes a first transistor 502 coupled to the supply node 112 and to the bulk node 414. A control terminal of the first transistor 502 is coupled to the node 408 corresponding to the failsafe indicator signal. A second transistor 504 is coupled to the bulk node 414 and to the pad node 210. A control terminal of the second transistor 504 is coupled to the supply node 112. A third transistor 506 is coupled to the pad node 210 and to the node 408 corresponding to the failsafe indicator signal. A control terminal of the third transistor 506 is also coupled to the supply node 112. In one example, a bulk of each of the first, second, and third transistors 502, 504, 506 is also coupled to the bulk node 414.

The failsafe circuit 500 also includes a fourth transistor 508 coupled to the node 408 corresponding to the failsafe indicator signal and to a node 509, a fifth transistor 510 coupled to the node 509, a ninth transistor 512 coupled to the fifth transistor 510, and a tenth transistor 514 coupled to the ninth transistor 512 and to a ground node. A control terminal of each of the fourth transistor 508, the fifth transistor 510, the ninth transistor 512, and the tenth transistor 514 is coupled to the supply node 112. In some examples, the ninth and tenth transistors 512, 514 may not be necessary and thus the fifth transistor 510 couples to the ground node.

The failsafe circuit 500 also includes a sub-circuit 515, which will be discussed further below. Additionally, the node 408 corresponding to the failsafe indicator signal is coupled to the input of an inverter 524, an output of which is coupled to the node 410 corresponding to the inverted failsafe indicator signal. The inverter 524 includes a transistor 526 and a transistor 528, in this case a p-type MOSFET and an n-type MOSFET, respectively, which are drain-coupled to provide the output of the inverter 524. A source of the p-type MOSFET 526 is coupled to a supply node, while a source of the n-type MOSFET is coupled to ground. The input of the inverter 524 is coupled to the gates of the p-type and n-type MOSFETs 526, 528.

Generally, the failsafe circuit 500 functions to either couple the bulk node 414 to the higher-voltage node of the supply node 112 (e.g., via the first transistor 502) or to the pad node 210 (e.g., via the second transistor 504). As explained above, this allows the body diode of the final-stage transistor 302 to remain reverse biased both when the supply voltage source is available and supplying the supply node 112 and when the supply voltage source is unavailable and an exterior device attempts to drive the I/O pin, causing a pad node 210 voltage to exceed a supply node 112 voltage.

Figure 6A:
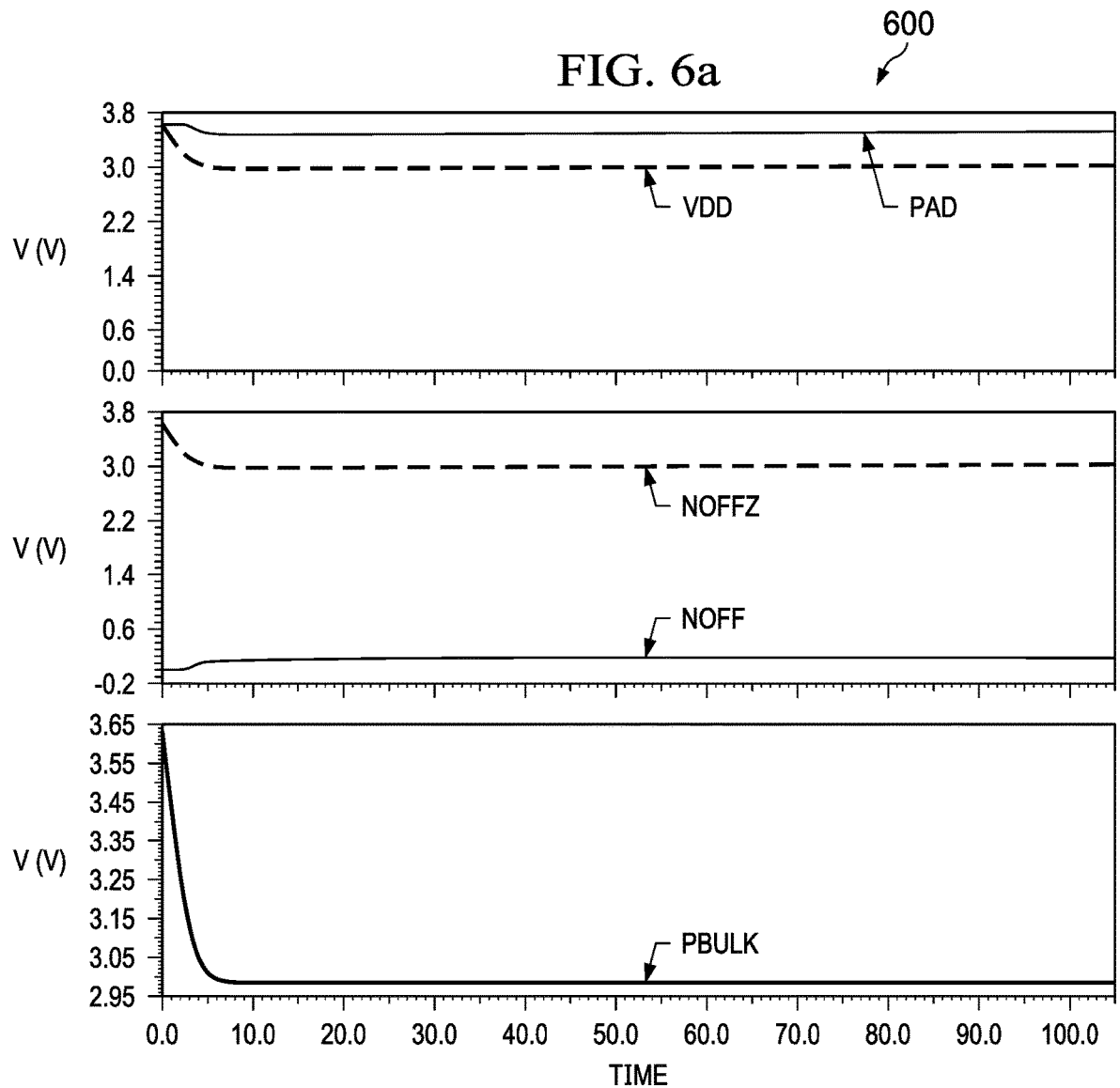
FIGS. 6a and 6b show exemplary waveforms associated with nodes of the failsafe circuit in accordance with various examples.

FIG. 6a shows a set of waveforms 600 corresponding to voltages of various nodes in the failsafe circuit 500 of FIG. 5, with the sub-circuit 515 omitted. The PAD waveform corresponds to a voltage at the pad node 210. The VDD waveform corresponds to a voltage at the supply node 112. The NOFF waveform corresponds to a voltage at the node 408 corresponding to the failsafe indicator signal, while the NOFFZ waveform corresponds to a voltage at the node 410 corresponding to the inverted failsafe indicator signal. Finally, the PBULK waveform corresponds to a voltage at the bulk node 414.

Referring to the waveforms of FIG. 6a along with FIG. 5, initially the supply voltage source is available, and thus the supply node 112 (VDD) is at a high voltage, or approximately 3.8V in this example. As a result, the second and third transistors 504, 506 are off (as exemplary p-type MOSFETs), while the fourth, fifth, ninth, and tenth transistors 508, 510, 512, 514 are on (as exemplary n-type MOSFETs), which pulls the node 408 (NOFF) to ground. Since the node 408 is also coupled to the control terminal of the first transistor 502, the first transistor 502 as an exemplary p-type MOSFET is on and the supply node 112 (VDD) is coupled to the bulk node 414, which ensures that the body diode of the final-stage transistor 302 in FIG. 4 explained above is reverse biased, so an external device cannot drive current onto the I/O pin 210 coupled to the final-stage transistor 302. That is, there is no current path between the pad node and the supply node 112 in FIG. 4.

Further, if the supply voltage source is unavailable, and thus the supply node 112 (VDD) is at 0V, the second and third transistors 504, 506 are on, while the fourth, fifth, ninth, and tenth transistors 508, 510, 512, 514 are off, which pulls the node 408 (NOFF) to the pad node 210 (PAD) voltage. Since the node 408 is also coupled to the control terminal of the first transistor 502, the first transistor 502 is off, and thus the bulk node 404 is coupled to the pad node 210 through the second transistor 504. As above, this also ensures that the body diode of the final-stage transistor 302 in FIG. 4 explained above is reverse biased, so an external device cannot drive current onto the I/O pin 210 coupled to the final-stage transistor 302. That is, there is no current path between the pad node and the supply node 112 in FIG. 4.

However, as explained above, and as demonstrated in FIG. 6a, when the supply node 112 (VDD) discharges from a high voltage, metastability may occur, which prevents the body diode of the final-stage transistor 302 from being reverse biased, causing a current path between the pad node 210 and the supply node 112. In particular, when the supply node 112 (VDD) discharges to approximately a device threshold voltage (Vt, approximately 0.7V in this example) less than the pad node 210 (PAD), current flows from the pad node 210 to the supply node 112 in the failsafe circuit 500. In the example of FIG. 6a, the pad node 210 (PAD) remains at 3.8V while the supply node 112 (VDD) falls to approximately 3.1V, or Vt less than the pad node 210. At this point, the fourth, fifth, ninth, and tenth transistors 508, 510, 512, 514 are still on, which keeps the node 408 (NOFF) pulled low to ground. As a result, the first transistor 502 controlled by the node 408 is on, while the second transistor 504 has a drain voltage of approximately 3.8V (coupled to the pad node 210) and a gate voltage of approximately 3.1V, causing the second transistor 504 to conduct as well. As a result, there is a current path from the pad node 210 to the supply node 112 in the failsafe circuit, which leads to metastability when the supply node 112 (VDD) is discharging and simultaneously being charged by the pad node 210 (PAD). Further, because the bulk node 414 is coupled to the supply node 112 via the first transistor 502, which is on, the final-stage transistor 302 is forward biased, creating a current path from the pad node 210 to the supply node 112 in the I/O output driver 400 as well.

To address the issues caused by the metastable condition described above, examples of the present disclosure utilize the sub-circuit 515 to more quickly turn off the pull-down stack that includes the fourth, fifth, ninth, and tenth transistors 508, 510, 512, 514 in response to the supply node 112 (VDD) discharging. The sub-circuit 515 includes a sixth transistor 516 coupled to the pad node 210 and a seventh transistor 518 coupled to the sixth transistor 516 and to a node 519. A control terminal of the sixth transistor 516 is coupled to the supply node 112, while a control terminal of the seventh transistor 518 is coupled to the node 408 corresponding to the failsafe indicator signal. In this example, the sixth and seventh transistors 516, 518 are p-type MOSFETs. The sub-circuit also includes an eighth transistor 520 that is coupled to the supply node 112 and the node 509. A control terminal of the eighth transistor 520 is coupled to the node 519. In this example, the eighth transistor 520 is an n-type MOSFET.

Figure 6B:
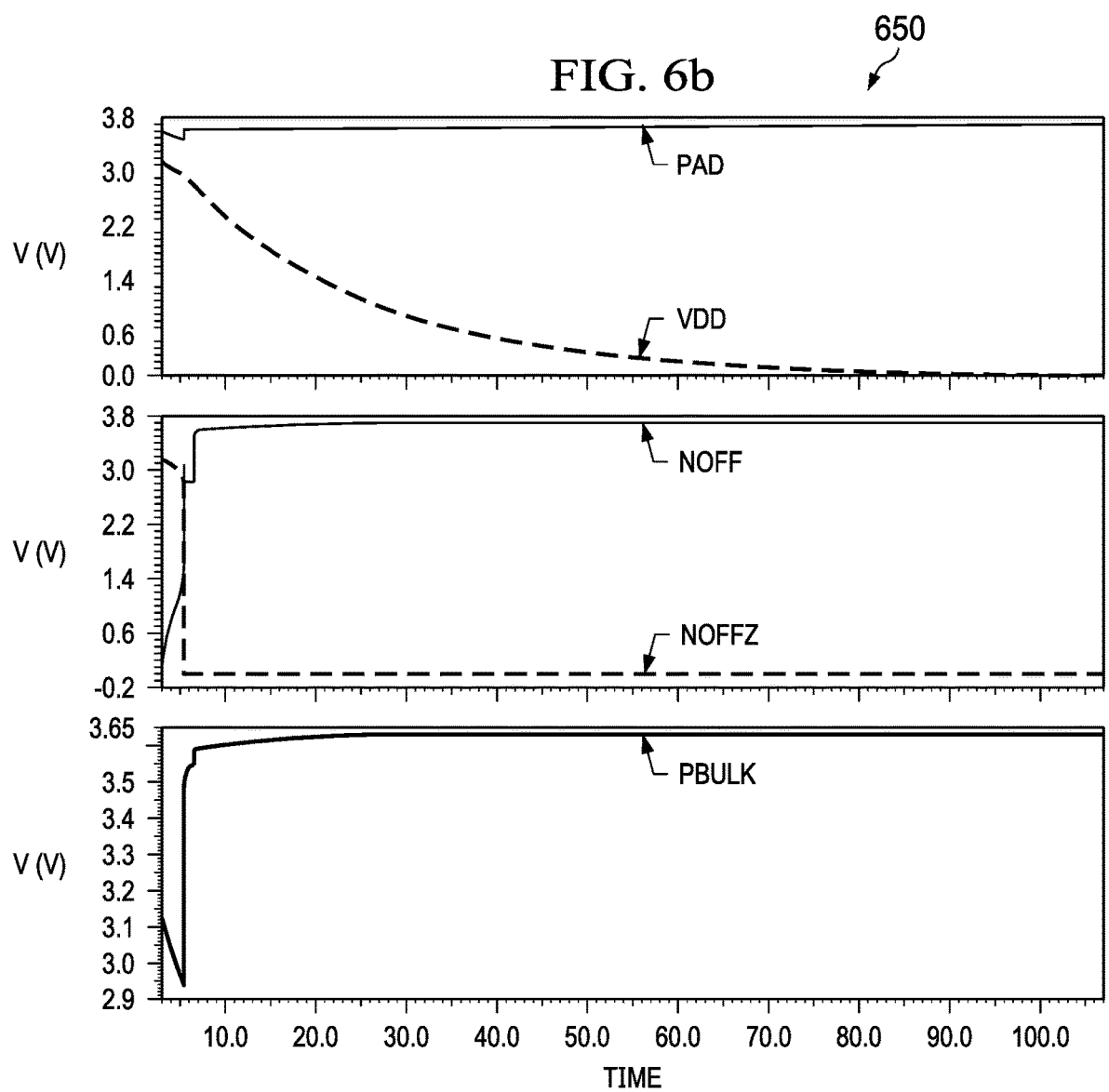

FIG. 6b shows a set of waveforms 650 corresponding to voltages of various nodes in the failsafe circuit 500 of FIG. 5, with the sub-circuit 515 included. The PAD waveform corresponds to a voltage at the pad node 210. The VDD waveform corresponds to a voltage at the supply node 112. The NOFF waveform corresponds to a voltage at the node 408 corresponding to the failsafe indicator signal, while the NOFFZ waveform corresponds to a voltage at the node 410 corresponding to the inverted failsafe indicator signal. Finally, the PBULK waveform corresponds to a voltage at the bulk node 414.

Referring to the waveforms of FIG. 6b along with FIG. 5, when the supply voltage source is available, and thus the supply node 112 (VDD) is at a high voltage, or approximately 3.8V in this example, the sixth transistor 516 is off. Thus, the node 519 is pulled to ground by a resistor 522 coupled to a ground node, and thus the eighth transistor 520 is off as well, and the remainder of the failsafe circuit 500 functions as described above. The resistor 522 provides a pulldown path for the eighth transistor 520 during normal operation, which isolates the sub-circuit 515 from the remainder of the failsafe circuit 500.

Subsequently, the supply node 112 (VDD) discharges from a high voltage and reaches a threshold voltage (Vt) below the pad node 210, which is a failsafe condition. When the supply node 112 (VDD) reaches Vt below the pad node 210, or approximately 3.1V continuing the above numerical example, the sixth transistor 516 turns on. Since the supply node 112 (VDD) has only fallen to Vt below the pad node 210, the pull-down stack of transistors 508, 510, 512, 514 is also still on as explained above, and thus the node 408 (NOFF) is low, and the seventh transistor 518 is also on. As a result of the sixth and seventh transistors 516, 518 being on, the pad node 210 voltage is provided to the control terminal (gate) of the eighth transistor 520, turning on the eighth transistor 520 as well.

Since the eighth transistor 520 is on, its drain voltage (the supply node 112 voltage (VDD)) is passed to the node 509. As a result, the fourth transistor 508 has a source voltage equal to the supply node 112 voltage (VDD) and its gate is also coupled to the supply node 112 and thus is at the same voltage (VDD), resulting in a gate-to-source voltage (Vgs) of 0V, which turns off the fourth transistor 508. As a result of the fourth transistor 508 being off, the pull-down stack of transistors 508, 510, 512, 514 is essentially off as well. Since the third transistor 506 slowly turns on as the supply node 112 voltage falls, and the node 408 is no longer coupled to the ground node via the pull-down stack of transistors 508, 510, 512, 514, the node 408 (NOFF) is charged to the pad node 210 voltage (PAD).

Unlike above, where the sub-circuit 515 was omitted, the node 408 (NOFF) is quickly isolated from the ground node by turning off the fourth transistor 508. As a result, the node 408 (NOFF) is allowed to charge to the pad node 210 voltage (PAD) via the third transistor 506. Since the node 408 (NOFF) voltage also controls the first transistor 502, this turns off the first transistor 502 which isolates the supply node 112 from the bulk node 414 and the pad node 210. Since the supply node 112 is decoupled from the pad node 210, the supply node 112 can fully discharge even when an external device is driving the pad node 210, as shown in FIG. 6b. The second transistor 504 also turns on as the supply node 112 (VDD) voltage decreases, which couples the pad node 210 to the bulk node 414 when the pad node 210 voltage is greater than the supply node 112 voltage, which prevents the body diode of the final-stage transistor 302 from being forward biased. Thus, in the example in which the sub-circuit 515 is employed, there is no current path between the pad node 210 and the supply node 112 in either the failsafe circuitry 500 or the I/O output driver 400.

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A device, comprising:
   a failsafe circuit comprising a supply node configured to couple to a supply voltage source, a pad node configured to couple to an input/output (I/O) pin, and a bulk node configured to couple to a bulk of a transistor coupled to the I/O pin, the failsafe circuit comprising:
   a first transistor coupled to the supply node and to the bulk node, the first transistor comprising a control terminal coupled to a first node;
   a second transistor coupled to the bulk node and to the pad node, the second transistor comprising a control terminal coupled to the supply node;
   a third transistor coupled to the pad node and to the first node, the third transistor comprising a control terminal coupled to the supply node;

a fourth transistor coupled to the first node and to a
second node, the fourth transistor comprising a control terminal coupled to the supply node;
a fifth transistor coupled to the second node and to a
ground node, the fifth transistor comprising a control
terminal coupled to the supply node;
a sixth transistor coupled to the pad node, the sixth
transistor comprising a control terminal coupled to
the supply node;
a seventh transistor coupled to the sixth transistor and
to a third node, the seventh transistor comprising a
control terminal coupled to the first node; and
an eighth transistor coupled to the supply node and to
the second node, the eighth transistor comprising a
control terminal coupled to the third node.

2. The device of claim 1, wherein the fifth transistor indirectly couples to the ground node, the failsafe circuit further comprising:
a ninth transistor coupled to the fifth transistor and a tenth transistor coupled to the ninth transistor and to the ground node, each of the ninth and tenth transistors comprising a control terminal coupled to the supply node.

3. The device of claim 1, further comprising a resistor coupled to the third node and to the ground node.

4. The device of claim 1, further comprising an inverter coupled to the first node, wherein the first node and an output of the inverter are configured to couple to a transmission gate coupled to a control terminal of the transistor coupled to the I/O pin.

5. The device of claim 1, wherein:
the first, second, third, sixth, and seventh transistors
comprise p-type metal-oxide-semiconductor field-effect transistors (MOSFETs) each comprising a gate, a source, and a drain; and
the fourth, fifth, and eighth transistors comprise n-type
MOSFETs each comprising a gate, a source, and a drain.

6. The device of claim 5, wherein:
the first transistor gate is coupled to the first node, the first transistor drain is coupled to the bulk node, and the first transistor source is coupled to the supply node;
the second transistor gate is coupled to the supply node, the second transistor drain is coupled to the pad node, and the second transistor source is coupled to the bulk node;
the third transistor gate is coupled to the supply node, the third transistor drain is coupled to the first node, and the third transistor source is coupled to the pad node;
the fourth transistor gate is coupled to the supply node, the fourth transistor drain is coupled to the first node, and the fourth transistor source is coupled to the second node;
the fifth transistor gate is coupled to the supply node, the fifth transistor drain is coupled to the second node, and the fifth transistor source is coupled to the ground node;
the sixth transistor gate is coupled to the supply node, the sixth transistor drain is coupled to the seventh transistor, and the sixth transistor source is coupled to the pad node;
the seventh transistor gate is coupled to the first node, the seventh transistor drain is coupled to the third node, and the seventh transistor source is coupled to the sixth transistor; and the eighth transistor gate is coupled to the third node, the eighth transistor drain is coupled to the supply node, and the eighth transistor source is coupled to the second node.

7. A system, comprising:
an input/output (I/O) circuit comprising a final-stage transistor coupled to an I/O pin and to a supply voltage source, the final-stage transistor comprising a control terminal configured to be coupled to an analog signal source; and
a failsafe circuit, comprising:
a first transistor coupled to the supply voltage source
and to a bulk of the final-stage transistor, the first
transistor comprising a control terminal coupled to a
first node;
a second transistor coupled to the bulk and to the I/O
pin, the second transistor comprising a control terminal coupled to the supply voltage source;
a third transistor coupled to the I/O pin and to the first
node, the third transistor comprising a control terminal coupled to the supply voltage source;
a fourth transistor coupled to the first node and to a
second node, the fourth transistor comprising a control terminal coupled to the supply voltage source;
a fifth transistor coupled to the second node and to a
ground node, the fifth transistor comprising a control
terminal coupled to the supply voltage source;
a sixth transistor coupled to the I/O pin, the sixth
transistor comprising a control terminal coupled to
the supply voltage source;
a seventh transistor coupled to the sixth transistor and
to a third node, the seventh transistor comprising a
control terminal coupled to the first node; and
an eighth transistor coupled to the supply voltage and
to the second node, the eighth transistor comprising
a control terminal coupled to the third node.

8. The system of claim 7, wherein the fifth transistor indirectly couples to the ground node, the failsafe circuit further comprising:
a ninth transistor coupled to the fifth transistor and a tenth transistor coupled to the ninth transistor and to the ground node, each of the ninth and tenth transistors comprising a control terminal coupled to the supply voltage source.

9. The system of claim 7, wherein the failsafe circuit further comprises a resistor coupled to the third node and to the ground node.

10. The system of claim 7, wherein:
the failsafe circuit further comprises an inverter coupled to the first node;
the I/O circuit further comprises a transmission gate coupled to the analog signal source and to the control terminal of the final-stage transistor; and
the first node and an output of the inverter are configured to control the transmission gate.

11. The system of claim 10, wherein the transmission gate is configured to couple the analog signal source to the control terminal of the final-stage transistor in response to the first node being de-asserted.

12. The system of claim 7, wherein:
the first, second, third, sixth, and seventh transistors
comprise p-type metal-oxide-semiconductor field-effect transistors (MOSFETs) each comprising a gate, a source, and a drain; and
the fourth, fifth, and eighth transistors comprise n-type
MOSFETs each comprising a gate, a source, and a drain.

13. The system of claim 7, wherein:
- the first transistor gate is coupled to the first node, the first transistor drain is coupled to the bulk node, and the first transistor source is coupled to the supply voltage source;
- the second transistor gate is coupled to the supply voltage source, the second transistor drain is coupled to the pad node, and the second transistor source is coupled to the bulk node;
- the third transistor gate is coupled to the supply voltage source, the third transistor drain is coupled to the first node, and the third transistor source is coupled to the pad node;
- the fourth transistor gate is coupled to the supply voltage source, the fourth transistor drain is coupled to the first node, and the fourth transistor source is coupled to the second node;
- the fifth transistor gate is coupled to the supply voltage source, the fifth transistor drain is coupled to the second node, and the fifth transistor source is coupled to the ground node;
- the sixth transistor gate is coupled to the supply voltage source, the sixth transistor drain is coupled to the seventh transistor, and the sixth transistor source is coupled to the pad node;
- the seventh transistor gate is coupled to the first node, the seventh transistor drain is coupled to the third node, and the seventh transistor source is coupled to the sixth transistor; and
- the eighth transistor gate is coupled to the third node, the eighth transistor drain is coupled to the supply voltage source, and the eighth transistor source is coupled to the second node.

* * * * *